United States Patent
O'Brien et al.

(10) Patent No.: US 10,388,858 B2
(45) Date of Patent: Aug. 20, 2019

(54) FABRICATION OF CRYSTALLINE MAGNETIC FILMS FOR PSTTM APPLICATIONS

(71) Applicant: Intel Corporation, Santa Clara, CA (US)

(72) Inventors: Kevin P. O'Brien, Portland, OR (US); Brian S. Doyle, Portland, OR (US); Kaan Oguz, Hillsboro, OR (US); Robert S. Chau, Beaverton, OR (US); Satyarth Suri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/503,357

(22) PCT Filed: Sep. 26, 2014

(86) PCT No.: PCT/US2014/057879
§ 371 (c)(1),
(2) Date: Feb. 10, 2017

(87) PCT Pub. No.: WO2016/048379
PCT Pub. Date: Mar. 31, 2016

(65) Prior Publication Data
US 2017/0271578 A1 Sep. 21, 2017

(51) Int. Cl.
*H01L 43/12* (2006.01)
*G11C 11/16* (2006.01)
(Continued)

(52) U.S. Cl.
CPC ............ *H01L 43/12* (2013.01); *G11C 11/161* (2013.01); *G11C 11/1659* (2013.01);
(Continued)

(58) Field of Classification Search
CPC ....... G02F 2203/16; G11C 11/16–1697; G11C 11/161; H01F 10/32–3295;
(Continued)

(56) References Cited

U.S. PATENT DOCUMENTS 8,829,631 B2 9/2014 Yamane et al.
9,184,375 B1 * 11/2015 Tang .................... H01L 27/222
(Continued)

FOREIGN PATENT DOCUMENTS

| TW | 201214429 | 4/2012 |
| TW | 201345009 | 11/2013 |
| TW | 201411825 | 3/2014 |

OTHER PUBLICATIONS

Intel Corporation, "International Preliminary Report on Patentability and Written Opinion", PCT Application No. PCT/US2014/057879 (dated Mar. 28, 2017).
(Continued)

*Primary Examiner* — Selim U Ahmed
(74) *Attorney, Agent, or Firm* — Schwabe, Williamson & Wyatt, P.C.

(57) ABSTRACT

A method including forming a device stack including a dielectric layer between a fixed magnetic layer and a free magnetic layer on a fully-crystalline sacrificial film or substrate including a crystal lattice similar to the crystal lattice of the dielectric material; and transferring the device stack from the sacrificial film to a device substrate. An apparatus including a device stack including a dielectric layer between a fixed magnetic layer and a free magnetic layer on a device substrate wherein the fixed magnetic layer and the free magnetic layer each have a crystalline lattice conforming to a crystalline lattice of the sacrificial film or substrate on which they were formed prior to transfer to the device substrate.

18 Claims, 12 Drawing Sheets

(51) Int. Cl.
*H01L 43/08* (2006.01)
*H01L 43/10* (2006.01)

(52) U.S. Cl.
CPC .......... *G11C 11/1675* (2013.01); *H01L 43/08* (2013.01); *H01L 43/10* (2013.01)

(58) Field of Classification Search
CPC . H03B 15/006; H01L 29/66984; H01L 27/22; H01L 29/82; H01L 43/00; H01L 43/12; H01L 43/08; H01L 43/10; G01R 33/06; Y10S 977/933–935; B81B 3/0091
See application file for complete search history.

(56) References Cited

U.S. PATENT DOCUMENTS

| | | |
|---|---|---|
| 2004/0252559 A1 | 12/2004 | Gupta |
| 2006/0017081 A1 | 1/2006 | Sun et al. |
| 2010/0276771 A1 | 11/2010 | Fukumoto et al. |
| 2013/0249028 A1* | 9/2013 | Kamata ................... H01L 43/08 257/427 |
| 2013/0277778 A1 | 10/2013 | Hsu et al. |
| 2013/0288392 A1 | 10/2013 | Nozieres et al. |
| 2013/0334630 A1 | 12/2013 | Kula et al. |
| 2014/0084399 A1 | 3/2014 | Doczy et al. |
| 2015/0091110 A1* | 4/2015 | Kuo ........................ H01L 43/08 257/421 |
| 2017/0271576 A1* | 9/2017 | O'Brien .................. H01L 43/08 |

OTHER PUBLICATIONS

Intel Corporation, "International Search Report and Written Opinion", PCT Application No. PCT/US2014/057879 (dated May 29, 2015).
Kurt, H. , et al., "Giant tunneling magnetoresistance with electron beam evaporated MgO barrier and CoFeB electrodes", Journal of Applied Physics, vol. 107, pp. 1-6, (Apr. 2010).
Extended European Search Report for European Patent Application No. 14902302.0 dated Apr. 17, 2018, 6 pgs.
Office Action for European Patent Application No. 14902302.0 dated Feb. 6, 2019, 3 pgs.
Office Action and Search Report for Taiwan Patent Application No. 104128130 dated Dec. 17, 2018, 8 pgs.
Notice of Allowance from Taiwan Patent Application No. 104128130, dated Mar. 18, 2019, 3 pgs.

* cited by examiner

FABRICATION OF CRYSTALLINE MAGNETIC FILMS FOR PSTTM APPLICATIONS

CROSS-REFERENCE TO RELATED APPLICATION

This patent application is a U.S. National Phase Application under 35 U.S.C. § 371 of International Application No. PCT/US2014/057879, filed Sep. 26, 2014, entitled METHODS OF FABRICATING CRYSTALLINE MAGNETIC FILMS FOR PSTTM APPLICATIONS.

BACKGROUND

Field

Memory devices and, in particular, spin transfer torque memory (STTM) devices.

Description of Related Art

The scaling of features in integrated circuits has been a driving force behind an ever-growing semiconductor industry. Scaling to smaller and smaller features generally enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will be spin polarized. With the passing of each electron, its spin (angular momentum) will be transferred to the magnetization in the next magnetic layer, called the free magnetic layer, and will cause a small change on the magnetization of such next layer. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about one to tens nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements.

DETAILED DESCRIPTION

One or more embodiments are directed to methodologies for increasing stability in a device stack including a dielectric layer between a fixed magnetic layer and a free magnetic layer, such as in a STTM stack by inhibiting device parameter degradation due to issues of crystallization of the free and fixed magnetic layers as well as dielectric filter layer process. Applications may include use in embedded memory, embedded non-volatile memory (NVM), magnetic random access memory (MRAM), magnetic tunnel junction (MTJ) devices, NVM, perpendicular MTJ, STTM, and non-embedded or stand-alone memories. In an embodiment, stability in STTM devices (perpendicular STTM, pSTTM) or in-plane STTM (iSTTM) is achieved by the introduction of a device stack (e.g., a memory stack) on a separate or sacrificial fully crystalline film or substrate and then the transfer of the stack to a device substrate (e.g., to a patterned product wafer).

Figure 1:
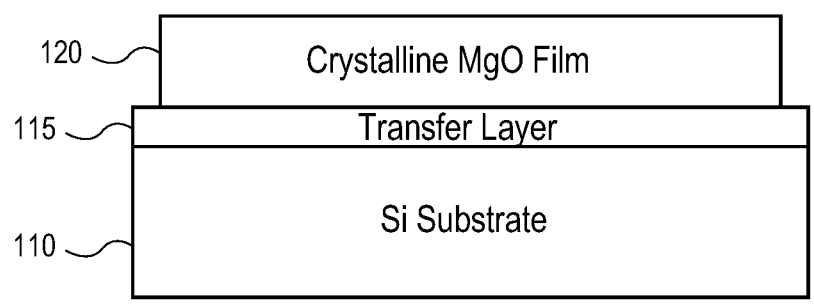
FIG. 1 shows a side view of a portion of a base substrate having a crystalline film formed thereon.

FIGS. 1-7 show one process of forming a device stack that is a memory stack. In one embodiment, the memory stack is a spin-transfer torque memory (STTM) stack, particularly a perpendicular STTM (pSTTM) stack. According to one method, the device stack is formed on a fully-crystalline sacrificial film and then, once formed, transferred from the sacrificial film to a device substrate. Referring to FIG. 1, FIG. 1 shows base substrate 110 that is, for example, a silicon substrate (e.g., wafer) or portion thereof. Disposed on base substrate 110 is transfer layer 115. Transfer layer 115, in one embodiment, is a material such as silicon dioxide (SiO$_2$) carbon doped low-k dielectric with low cohesive strength or a thermally decomposing polymer such as polyoxymethylene (POM) that will later be used as a separation point for a stack formed on base substrate 110. Disposed on transfer layer 115 is crystalline film 120. In one embodiment, crystalline film 120 is a fully crystalline magnesium oxide (MgO) material having, for example, a lattice crystal structure {001}. In one embodiment, crystalline film 120 has a thickness sufficient to impart or dominate a lattice structure of films or layers formed on the film. In one embodiment, crystalline film 120 has a thickness greater than a combined thickness of the individual layers that will make up an STTM memory device formed on the film. The representation of crystalline film 120 and other layers on base substrate are not to scale and are not intended to indicate a relative thickness of one film or layer to another.

Figure 2:
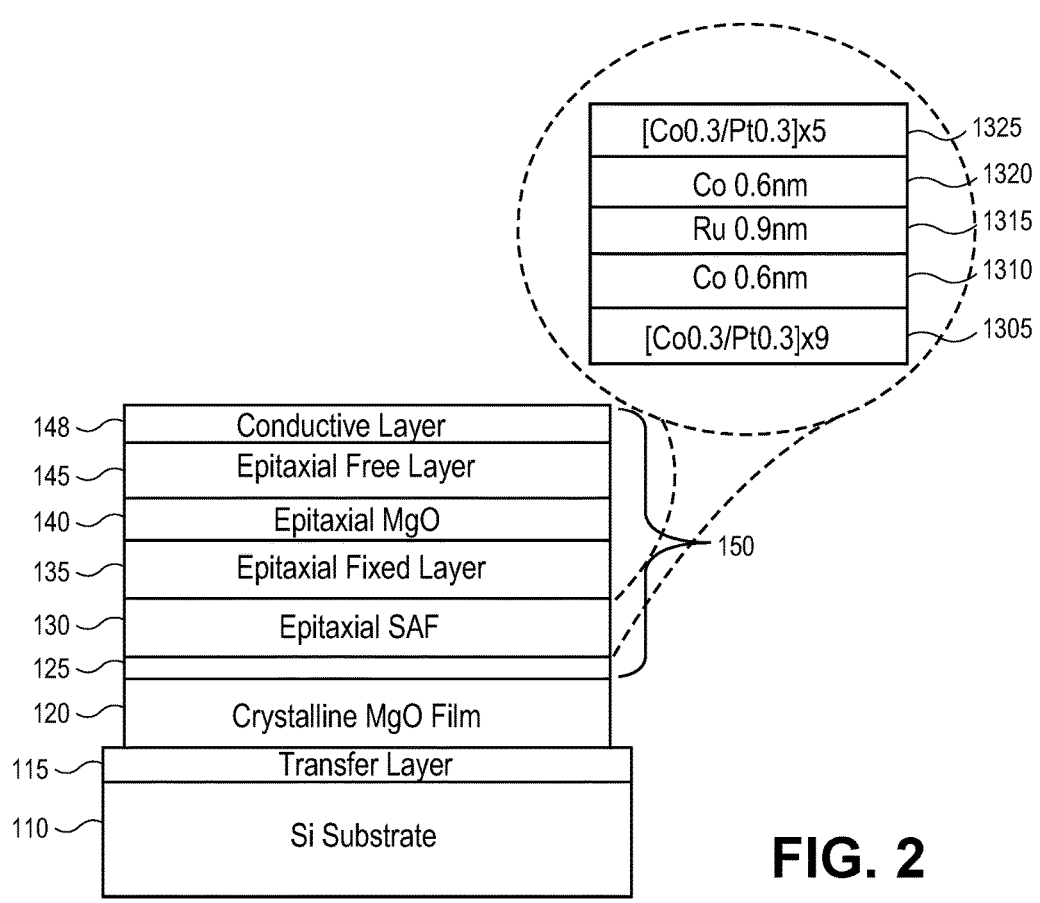
FIG. 2 shows the structure of FIG. 1 following the formation of an STTM stack on the crystalline film.

FIG. 2 shows the structure of FIG. 1 following the formation of an STTM stack on crystalline 120. In one embodiment, device stack 150 includes electrode layer 125 of a conductive material. In one embodiment, a conductive material for electrode layer 125 is a material that has the same lattice structure as underlying crystalline film 120 of MgO. A suitable material for electrode layer 125 is chrome (chromium). Another suitable electrode material is a conductive material, e.g., metal material or alloy, that will not force its crystalline structure on subsequent materials formed thereon. Representatively, relatively ductile conductive material (e.g., metal material or alloy) will conform to the crystalline structure of crystalline film 120. One example of a relatively ductile material is copper.

On electrode layer 125 on device stack 150 are a number of epitaxially formed layers beginning with a synthetic antiferromagnet (SAF) on electrode layer 125. In one embodiment, an SAF is defined by multiple layers of material. One such SAF disposes a ruthenium layer between heterostructures of cobalt-platinum. A representative SAF is shown in FIG. 2 and includes, from bottom to top as viewed, cobalt-platinum heterostructure layer 1305 (e.g., [Co0.3 nm/Pt0.3 nm]×9); cobalt layer 1310 having a representative thickness of 0.6 nm; ruthenium layer 1316 having a representative thickness of 0.9 nm; cobalt layer 1320 having a representative thickness of 0.6 nm; and cobalt-platinum heterostructure layer 1325 (e.g., [Co0.3 nm/Pt0.3 nm]×5). Without wishing to be bound by theory, for a perpendicular memory stack, an SAF based on a cobalt-platinum ferromagnet heterostructure coupled by a ruthenium layer through an RKKY interaction means the cobalt-platinum heterostructures on opposing sides of the ruthenium will tend to have perpendicular magnetic moments but in opposite directions. It is appreciated that the foregoing is one representative example of an SAF for a perpendicular memory device.

On SAF 130 is fixed magnetic layer 135. In one embodiment, for a perpendicular memory stack, a fixed magnetic layer and a free magnetic layer are each cobalt-iron-boron (CoFeB). A representative thickness of fixed magnetic layer 135 of CoFeB is less than two nanometers, such as approximately 1.4 to 1.6 nm. On fixed magnetic layer 135 is dielectric layer 140 of, for example, MgO. A representative thickness for dielectric layer 140 of MgO is one nanometer. On dielectric layer 140 is free magnetic layer 145 of, for example, FeCoB and having a thickness of less than two nanometers. On free magnetic layer 145 is conductive layer 148 of, for example, tantalum or tungsten having a representative thickness of up to 5 nm. It is appreciated that the representative memory stack described may incorporate additional layers such as insertion layers, filter layers and/or seed layers as desired. The memory stack is illustrated as multiple layers each having a rectangular shape. It is appreciated that a cross-sectional shape of a layer can representatively depend on, among other things, a material property, an introduction technique and/or tool, and a shape (e.g., surface) of any underlying layer. Therefore, an illustration as a rectangular shape should be broadly interpreted to include other possible cross-sectional shapes including, but not limited to, trapezoidal, a parallelogram, or other polygonal shape.

Figure 3:
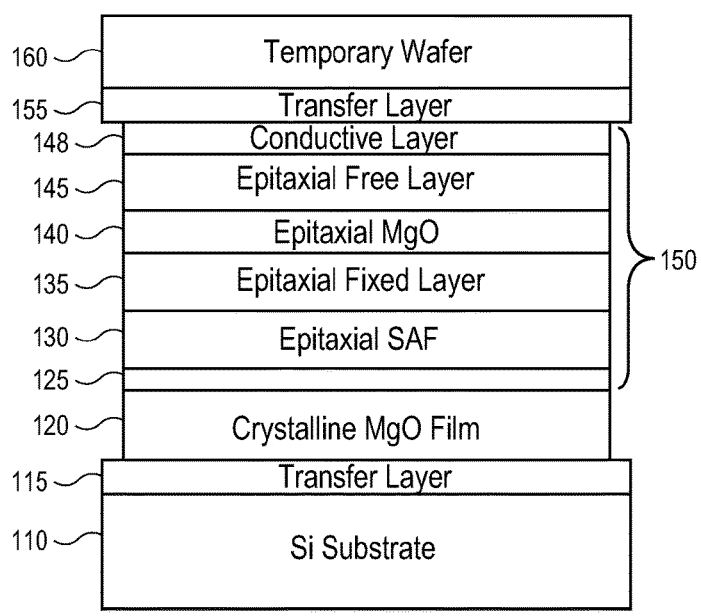
FIG. 3 shows the structure of FIG. 2 following the introduction of a temporary wafer on the device stack.

FIG. 3 shows the structure of FIG. 1 following the introduction of a temporary wafer on device stack 150. FIG. 3 shows transfer layer 155 disposed on free magnetic layer 145 and temporary wafer 160 disposed on the transfer layer. In one embodiment, transfer layer 135 is a multilayer structure including, as an initial layer on conductive layer 148, a material similar to transfer layer 150 such as, for example, an SiO$_2$ carbon doped low-k dielectric with low cohesive strength or a thermally decomposing polymer such as POM material. On the initial layer is, for example, a layer of SiO$_2$ for oxide bonding to a temporary wafer. Temporary wafer 160 is, for example, a silicon wafer of portion thereof.

Figure 4:
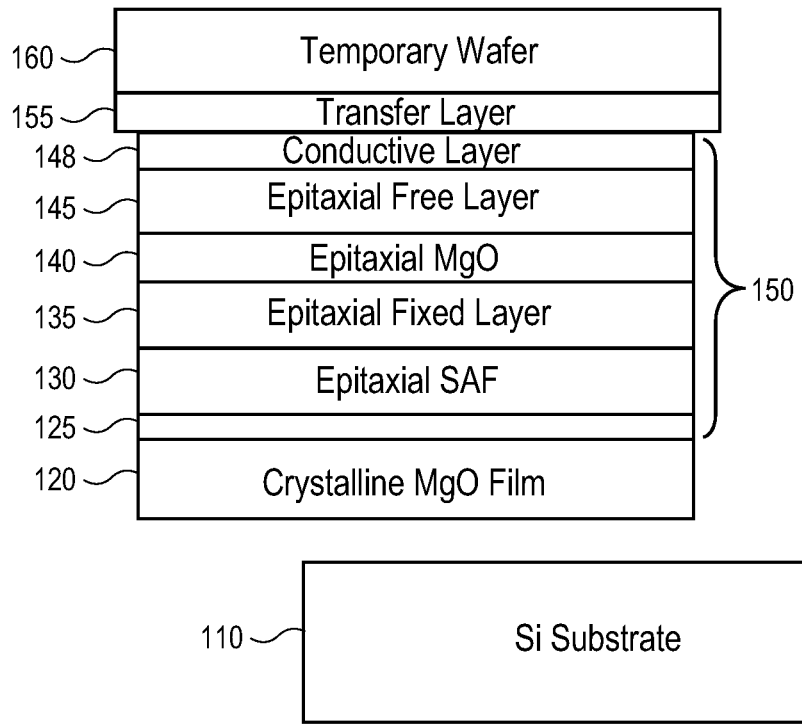
FIG. 4 shows the structure of FIG. 3 following the separation of the base substrate from the device stack.

FIG. 4 shows the structure of FIG. 3 following the separation of base substrate 110 from the device stack. As illustrated in FIG. 4, one way to separate the device stack from base substrate 110 is by separating the two at transfer layer 115. For a transfer layer of a material having a low cohesive strength material, the material may be physically cracked. A transfer layer of a material that has a relatively low deposition temperature can be heated to such temperature to effect a separation.

Figure 5:
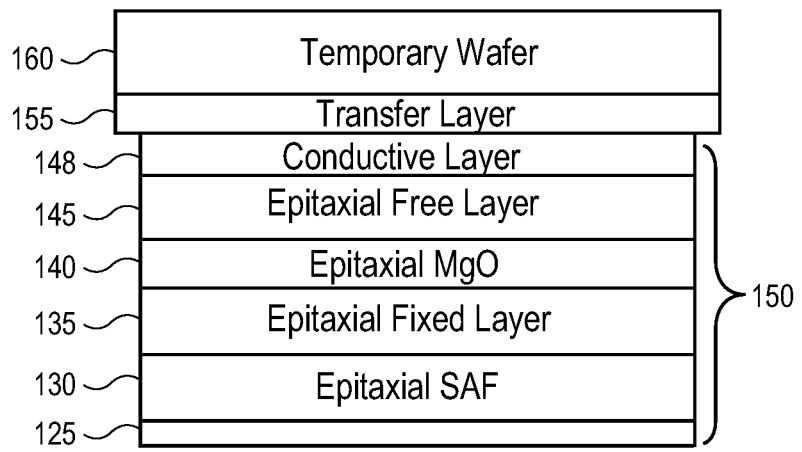
FIG. 5 shows the structure of FIG. 4 following the removal of the crystalline film.

FIG. 5 shows the structure of FIG. 4 following the removal of crystalline film 120. In one embodiment, crystalline MgO film 120 may be removed by an etch (e.g., wet or dry etch) or polishing process.

Figure 6:
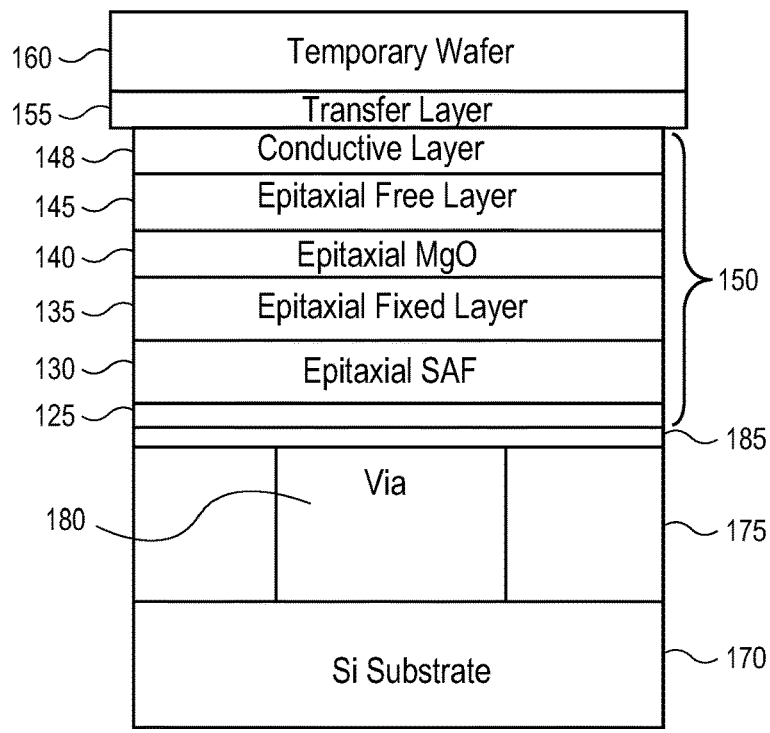
FIG. 6 shows the structure of FIG. 7 following the attachment of the device stack to a device substrate.
Figure 7:
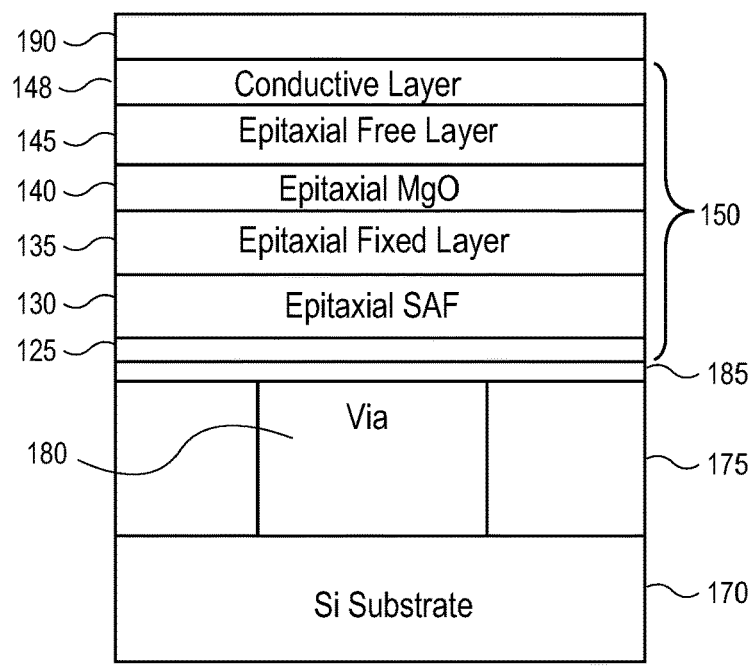
FIG. 7 shows the structure of FIG. 6 following the removal of the temporary wafer.

FIG. 6 shows the structure of FIG. 7 following the attachment of the device stack to a device substrate. FIG. 6 shows device substrate 170 that is, for example, a silicon wafer or portion thereof having a device layer formed thereon including integrated circuit such as a memory circuit. Device substrate 170 has formed thereon dielectric layer 175, for example, a suitable interlayer dielectric. FIG. 6 also shows conductive via 180 disposed through dielectric layer 175 to, for example, a device formed in or on substrate 170. Disposed on via 180 is conductive glue layer 185 of, for example, a material such as a chromium glue layer. Electrode 125 of device stack 150 is connected to device substrate 170 at glue layer 185.

FIG. 7 shows the structure of FIG. 6 following the removal of temporary wafer 160. In one embodiment, temporary wafer 160 may be removed from the device stack by the removal of transfer layer 155 by, for example, etching.

The above process may be used to form a device stack such as a pSTTM memory stack including a stack of epitaxially formed layers (e.g., epitaxially formed free magnetic layer and fixed magnetic layer and dielectric layer) that conform to a crystal lattice of a crystalline film on a base substrate (e.g., a crystalline MgO film) (e.g., a similar lattice constant as the lattice constant of the crystalline film). Once the device stack is transferred to a device substrate, such as device substrate 170, a second electrode may be introduced on free magnetic layer 145 and the device stack connected to a circuit, such as a memory circuit. FIG. 7 shows electrode 190 representatively formed on device stack 150. Electrode 190 is, representatively, a circuit interconnect material such as copper or other electrode material as known in the art (e.g., ruthenium).

Figure 8:
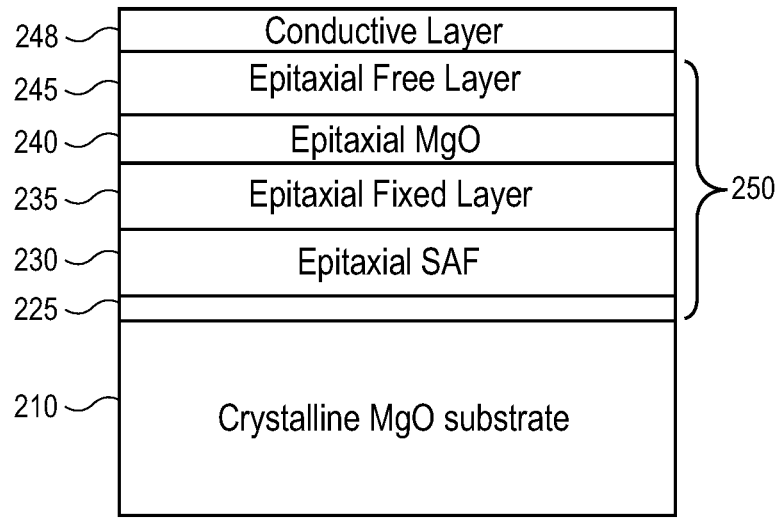
FIG. 8 shows a crystalline substrate or other material having a desired crystal lattice for a device layer.

FIGS. 8-14 show a second embodiment of forming a device stack such as a memory stack. In this method, the device stack is formed on a crystalline substrate rather than a crystalline film. Referring to FIG. 8, FIG. 8 shows a crystalline substrate or other material having a desired crystal lattice for a device layer. For a pSTTM memory stack including a tunneling oxide of MgO, a suitable crystalline substrate is a crystal MgO substrate. Crystalline substrate 210 has a thickness suitable to impart a crystal lattice orientation to film formed thereon. In one embodiment, a crystalline substrate of MgO has a {001} lattice structure.

On crystalline substrate 210 is device stack 250. In one embodiment, device stack 250 is similar to device stack 150 described with reference to FIGS. 1-7 and includes electrode layer 225 of, for example, chromium and epitaxially formed SAF 230, fixed magnetic layer 235 of, for example, CoFeB, tunneling dielectric layer 240 of MgO, free magnetic layer 245 of, for example, CoFeB, and conductive layer 248 of, for example, tantalum or tungsten.

Figure 9:
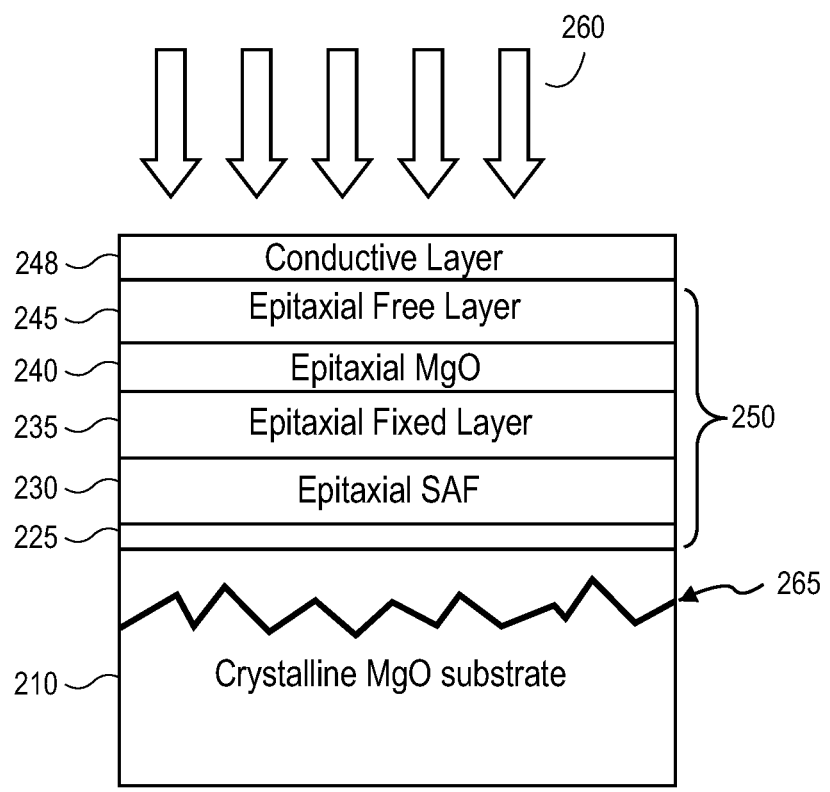
FIG. 9 shows the structure of FIG. 8 following the introduction of a damage region in a crystalline substrate.

FIG. 9 shows the structure of FIG. 8 following the introduction of a damage region in crystalline substrate 210. In one embodiment, a process to form a damage layer in the underlying crystalline substrate 210 utilizes an implant, such as a helium implant. The helium implant forms damage or weakened region 265 that allows crystalline substrate 210 to be fractured.

Figure 10:
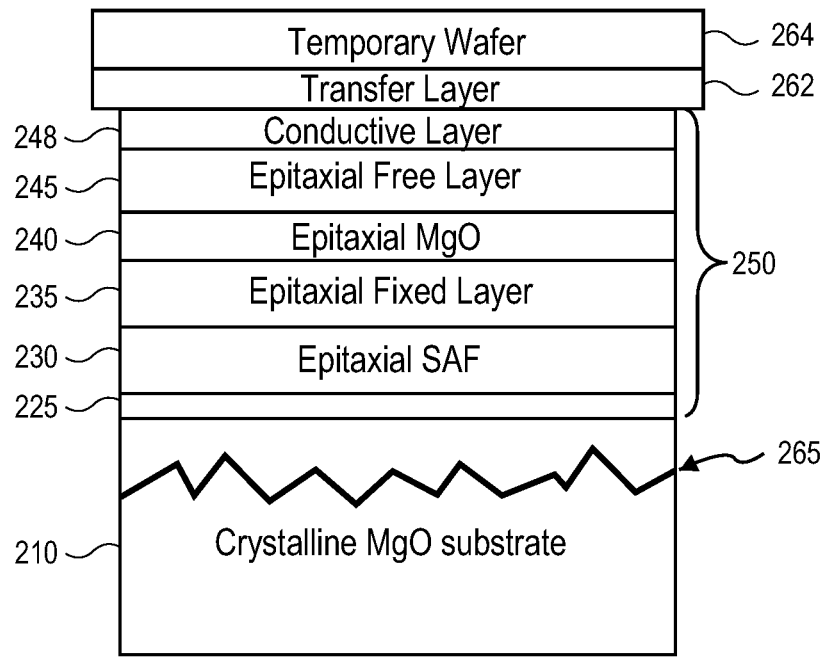
FIG. 10 shows the structure of FIG. 9 following the introduction of a transfer layer and a temporary wafer on the device stack.

FIG. 10 shows the structure of FIG. 9 following the introduction of transfer layer 262 and temporary wafer 264 on device stack 250. Temporary wafer 264 and transfer layer 262 may be similar to the transfer layer and wafer described above with reference to FIG. 3 and the accompanying text.

Figure 11:
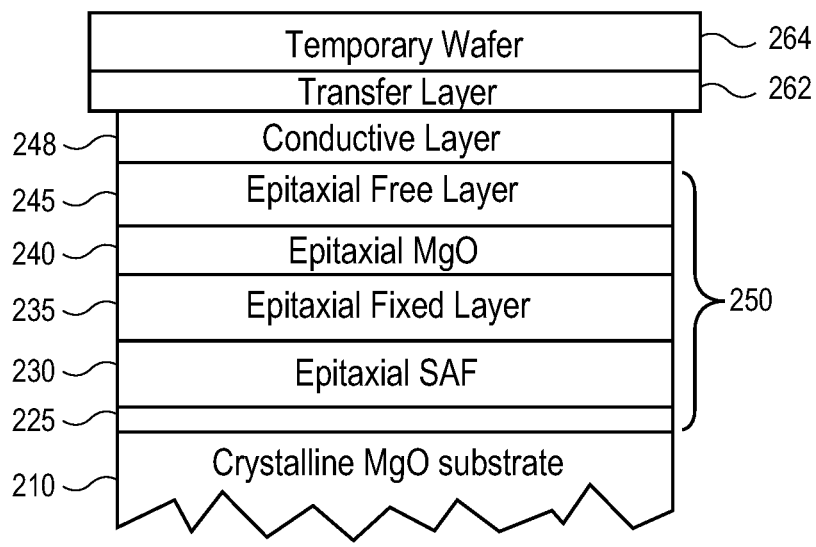
FIG. 11 shows the structure of FIG. 10 following the fracture of a crystalline substrate at the damage region.
Figure 12:
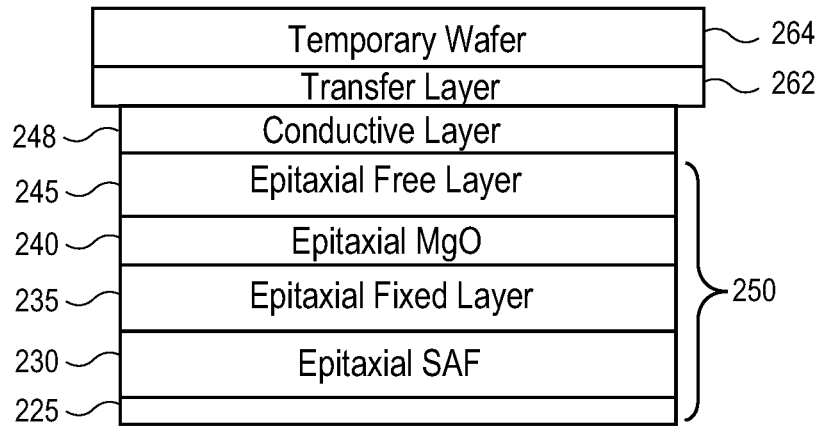
FIG. 12 shows the structure of FIG. 11 following the removal of the retained portion of the crystalline substrate and the exposure of the electrode.

FIG. 11 shows the structure of FIG. 10 following the fracture of crystalline substrate 210 at damage region 265. FIG. 12 shows the structure of FIG. 11 following the removal of the retained portion of crystalline substrate 210 and the exposure of electrode 225. The crystalline substrate portion may be removed by an etch or polishing process.

Figure 13:
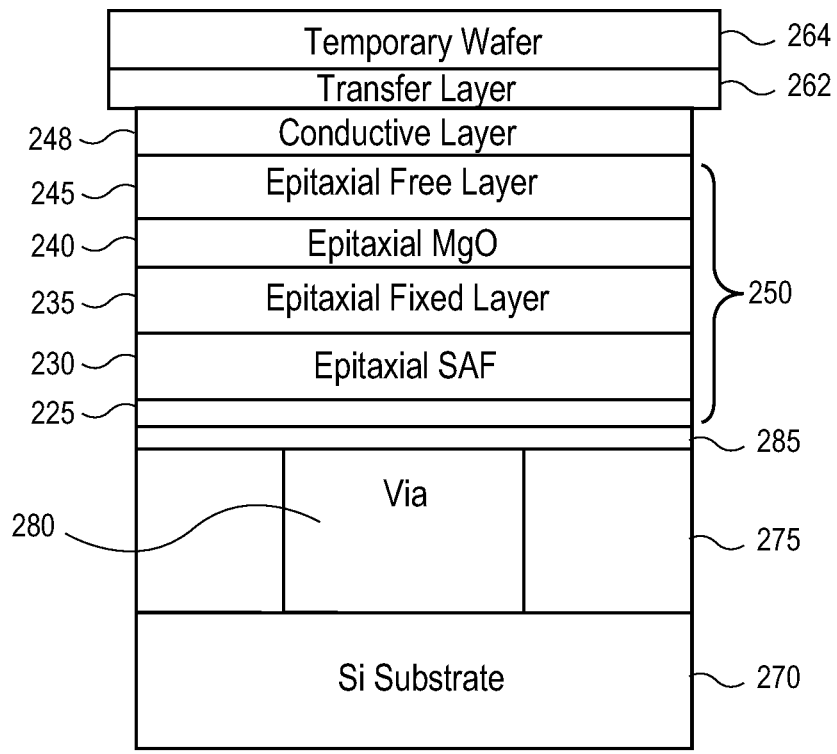
FIG. 13 shows the structure of FIG. 12 following the attachment of the device stack to a device substrate.

FIG. 13 shows the structure of FIG. 12 following the attachment of device stack 250 to a device substrate. FIG. 13 shows device substrate 270 having devices formed thereon. Disposed on device substrate 270 is dielectric layer 275 and conductive via 280 disposed through dielectric layer 275 to a device in or on substrate 270. FIG. 13 shows device stack 250 connected to via 280 away of a metal glue layer 285. Representatively, glue layer 285 is a chromium material to match a chromium material of electrode layer 225.

Figure 14:
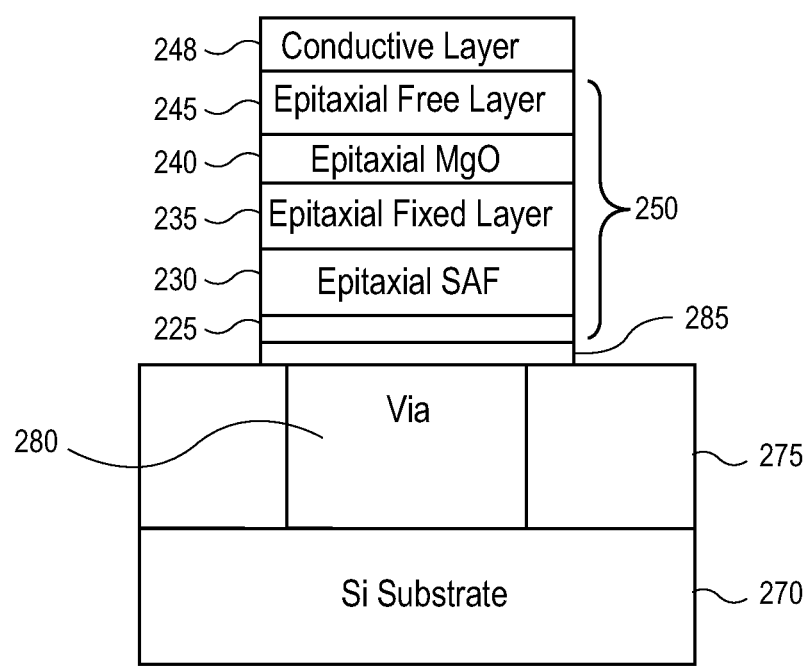
FIG. 14 shows the structure of FIG. 13 following the removal of the temporary wafer.

FIG. 14 shows the structure of FIG. 13 following the removal of temporary wafer 264. In one embodiment, temporary wafer 264 may be separated from device stack 250 by removal of transfer layer 262 by, for example, an etch process. Once the temporary wafer is removed, the device stack 250 may be connected to a circuit as known in the art.

Figure 15:
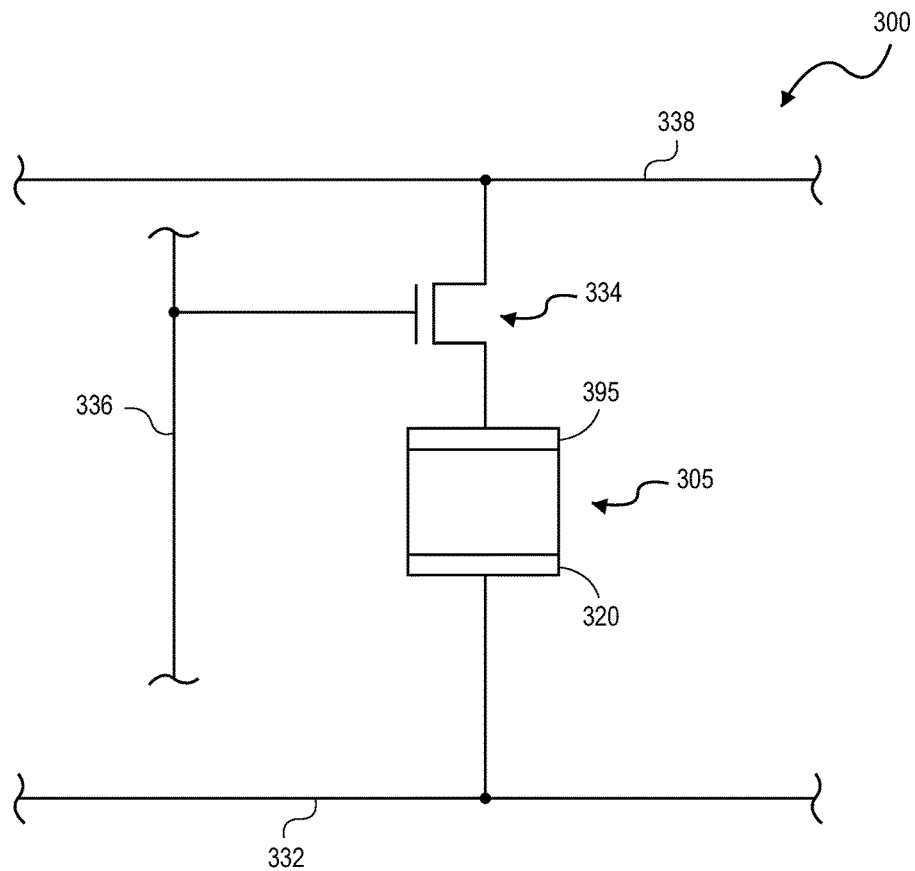
FIG. 15 illustrates a schematic of a spin transfer torque memory bit cell which includes a spin transfer torque element.

A stack of layers including magnetic material layers and an oxide layer of device stack 150 or device stack 250 described with references to FIG. 1-7 (device stack 150) and FIGS. 8-14 (devices stack 250), respectively, may be used to fabricate as memory bit cell. FIG. 15 illustrates a schematic of a spin transfer torque memory bit cell 300. Referring to FIG. 15, cell 305, in one embodiment, includes a device stack such as device stack 150 or device stack 250 described above. FIG. 15 shows cell 305 including first electrode 320 and second electrode 395. Disposed between the first and second electrodes is a magnetic tunnel junction (MTJ) and SAF and optional insertion layer and/or filter layer.

In an embodiment, cell 305 is based on perpendicular magnetism. First electrode 320 is electrically connected to a bit line 332. Second electrode 390 is electrically connects with transistor 334. Transistor 334 is connected with word line 336 and source line 338 in a manner that will be understood to those skilled in the art. Spin transfer torque memory bit cell 300 may further include additional read and write circuitry (not shown), a sense amplifier (not shown), a bit line reference (not shown), and the like, as will be understood by those skilled in the art, for the operation of the spin transfer torque memory bit cell 300. It is to be understood that a plurality of the spin transfer torque memory bit cells 300 may be operably connected to one another to form a memory array (not shown), wherein the memory array can be incorporated into a non-volatile memory device. It is to be understood that the transistor 334 may be connected to fixed magnetic layer electrode 350 or the free magnetic layer electrode 370, although only the latter is shown.

Figure 16:
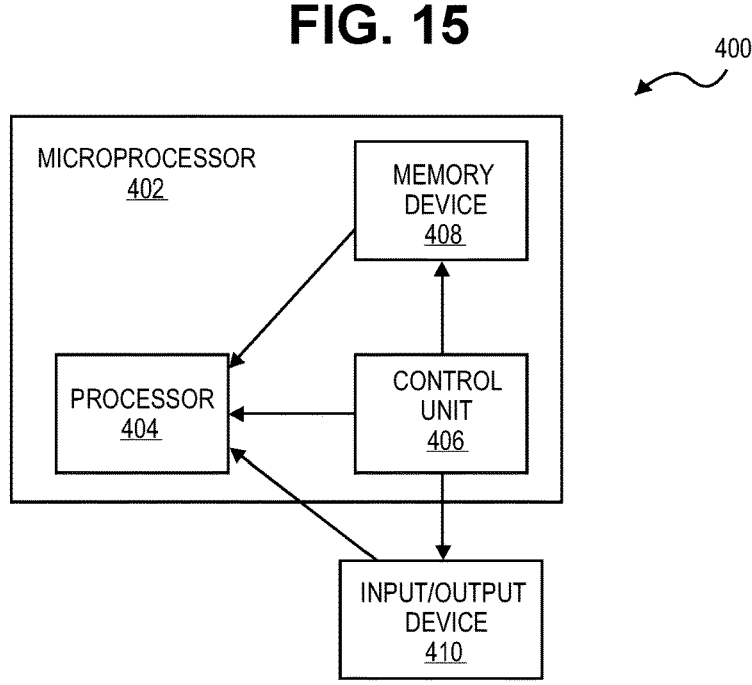
FIG. 16 illustrates a block diagram of an electronic system, in accordance with an embodiment.

FIG. 16 illustrates a block diagram of electronic system 400, in accordance with an embodiment. Electronic system 400 can correspond to, for example, a portable system, a computer system, a process control system, or any other system that utilizes a processor and an associated memory. Electronic system 400 may include microprocessor 402 (having processor 404 and control unit 406), memory device 408, and input/output device 410 (it is to be understood that electronic system 400 may have a plurality of processors, control units, memory device units and/or input/output devices in various embodiments). In one embodiment, electronic system 400 has a set of instructions that define operations which are to be performed on data by processor 404, as well as, other transactions between processor 404, memory device 408, and input/output device 410. Control unit 406 coordinates the operations of processor 404, memory device 408 and input/output device 410 by cycling through a set of operations that cause instructions to be retrieved from memory device 408 and executed. Memory device 408 can include memory bit cells as described above. In an embodiment, memory device 408 is embedded in microprocessor 402, as depicted in FIG. 16.

Figure 17:
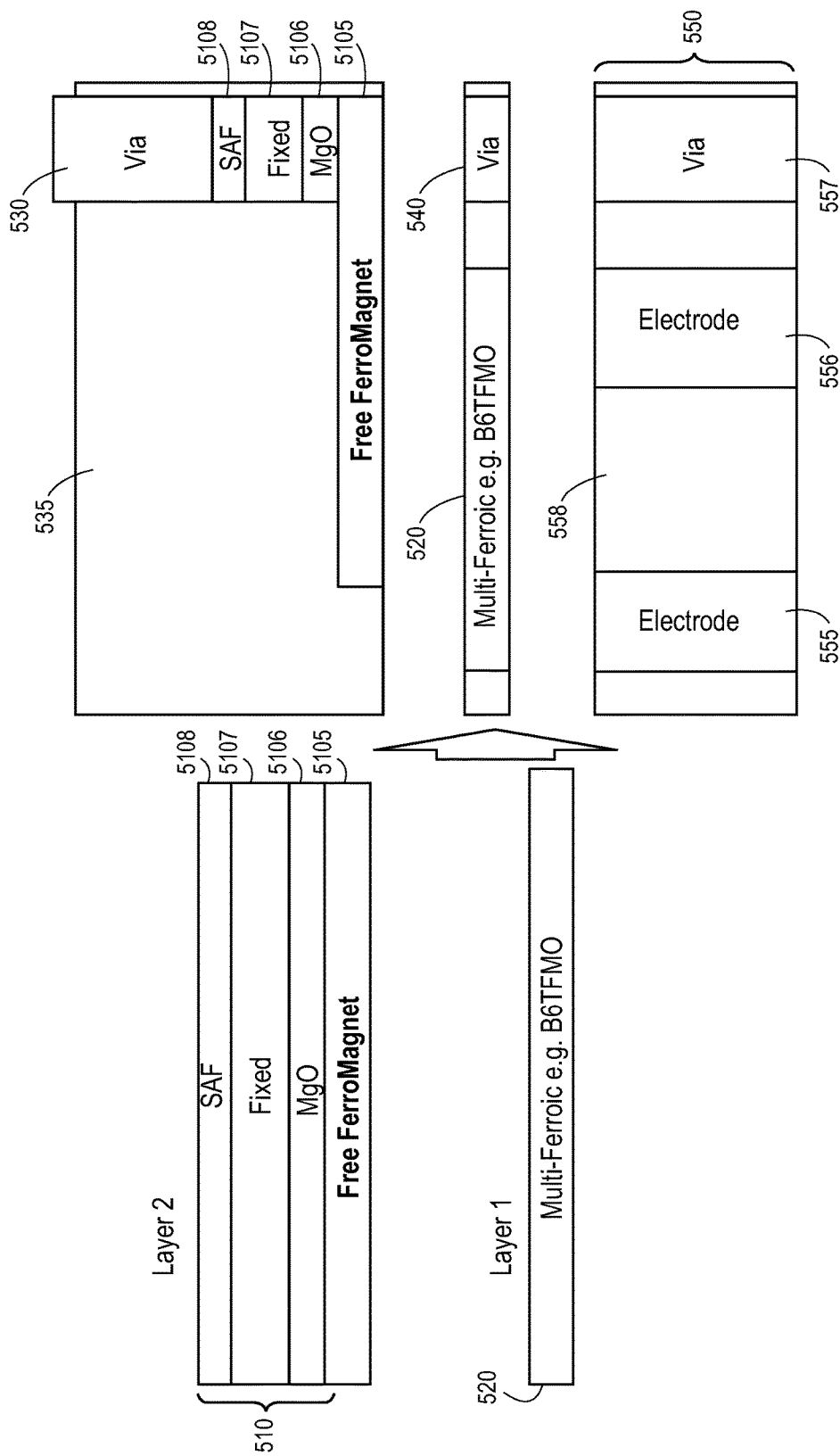
FIG. 17 illustrates a side view of separately formed STTM stack and a multi-ferroic layer and an exploded view of a structure including the STTM stack and the multi-ferroic layer.
Figures 18, 19:
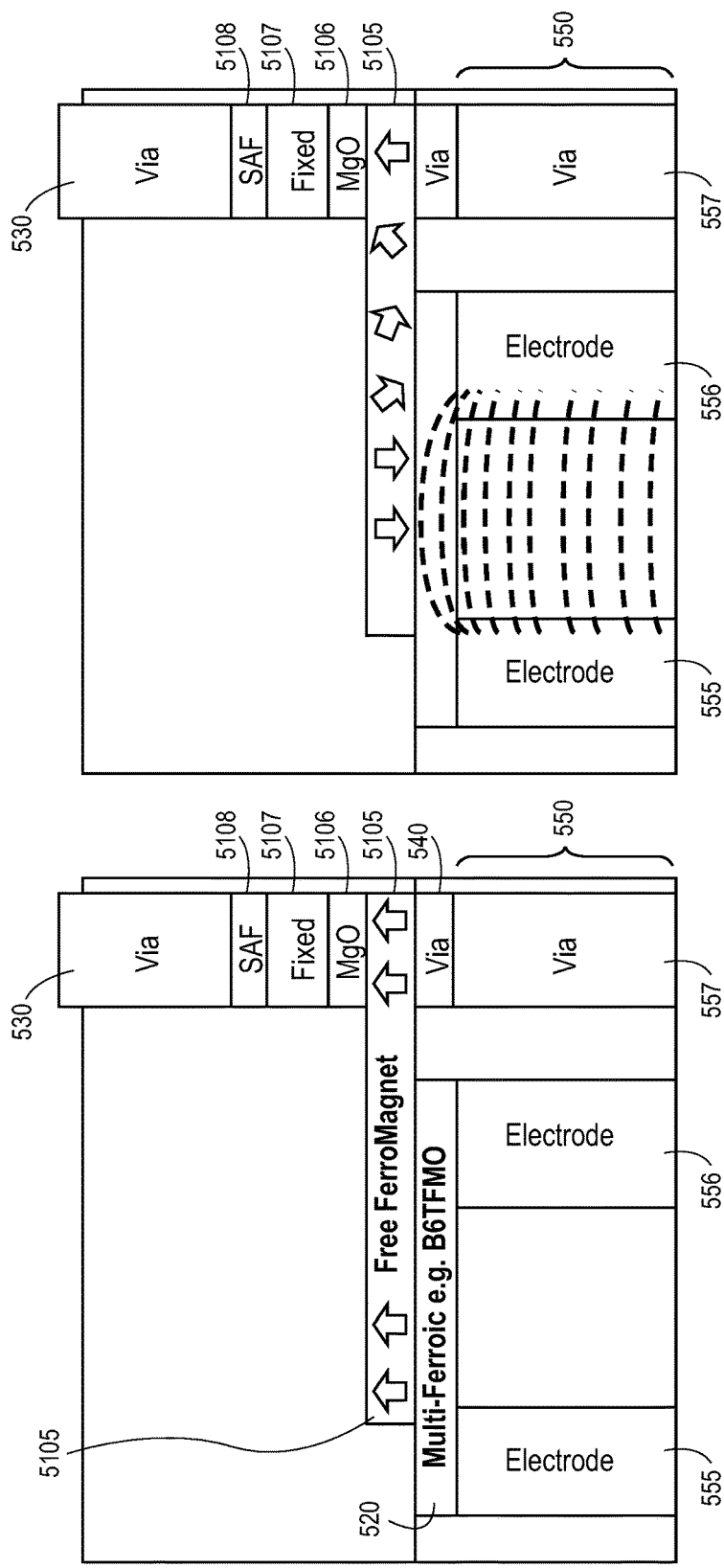
FIG. 18 shows a side view of the assembled structure including an STTM stack and a multi-ferroic layer and the polarization of the free ferromagnetic layer of the STTM stack.
FIG. 19 shows the structure of FIG. 18 and indicates the polarization change of the free ferromagnetic layer upon exposure to an electric field.

The above embodiments describe a process of forming a device stack that is a memory stack such as a pSTTM stack as well as a memory bit cell including the stack and an electronic system incorporating a memory device including memory bit cells. It is appreciated that the process of forming a device stack on a fully-crystalline sacrificial film or substrate having a desired crystal lattice and then transferring the device stack to a device substrate is not limited to a memory stack or STTM stack. FIGS. 17-19 illustrate an application related to multi-ferroic devices. Multi-ferroic devices rely on a change in properties of a multi-ferroic material under the influence of an electric field to change a magnetization of a free ferromagnetic which in turn is connected to an STTM. Referring to FIG. 17, the illustration shows on the left hand side an STTM stack such as described above that is separate multi-ferroic layer. STTM stack 510 includes a layer stack including free ferromagnetic layer 5105, oxide layer 5106, fixed ferromagnetic layer 5107 and SAF 5108 one layer on the next as described. Such STTM stack may be formed on a sacrificial film or substrate having a desired crystal lattice such as described above. Similarly, FIG. 17 shows multi-ferroic layer 520 of a material such as B6TFMO ($Bi_6Ti_{2.8}Fe_{1.52}Mn_{0.68}O_{18}$) may also be formed on a sacrificial substrate having a desired crystal lattice such that such crystal lattice will be imparted to the multi-ferroic layer. The right side of FIG. 17 shows an exploded view of an assembly of STTM stack 510 patterned and disposed in dielectric layer 535 and conductive via 530 connected thereto. Conductive via 530 is formed through multi-ferroic layer 520. STTM stack 510 and multi-ferroic layer 520 are aligned over substrate 550 that is a device substrate including thereon dielectric material 558 with electrode 555, electrode 556 and conductive via 557 disposed through the dielectric to a device substrate. FIG. 18 shows the assembled structure of FIG. 17. FIG. 19 illustrates an operation of the device of FIG. 18 and shows an electric field from electrode 555 and electrode 556 changing a polarization of free ferromagnetic layer 5105 which propagates to the STTM stack.

Figure 20:
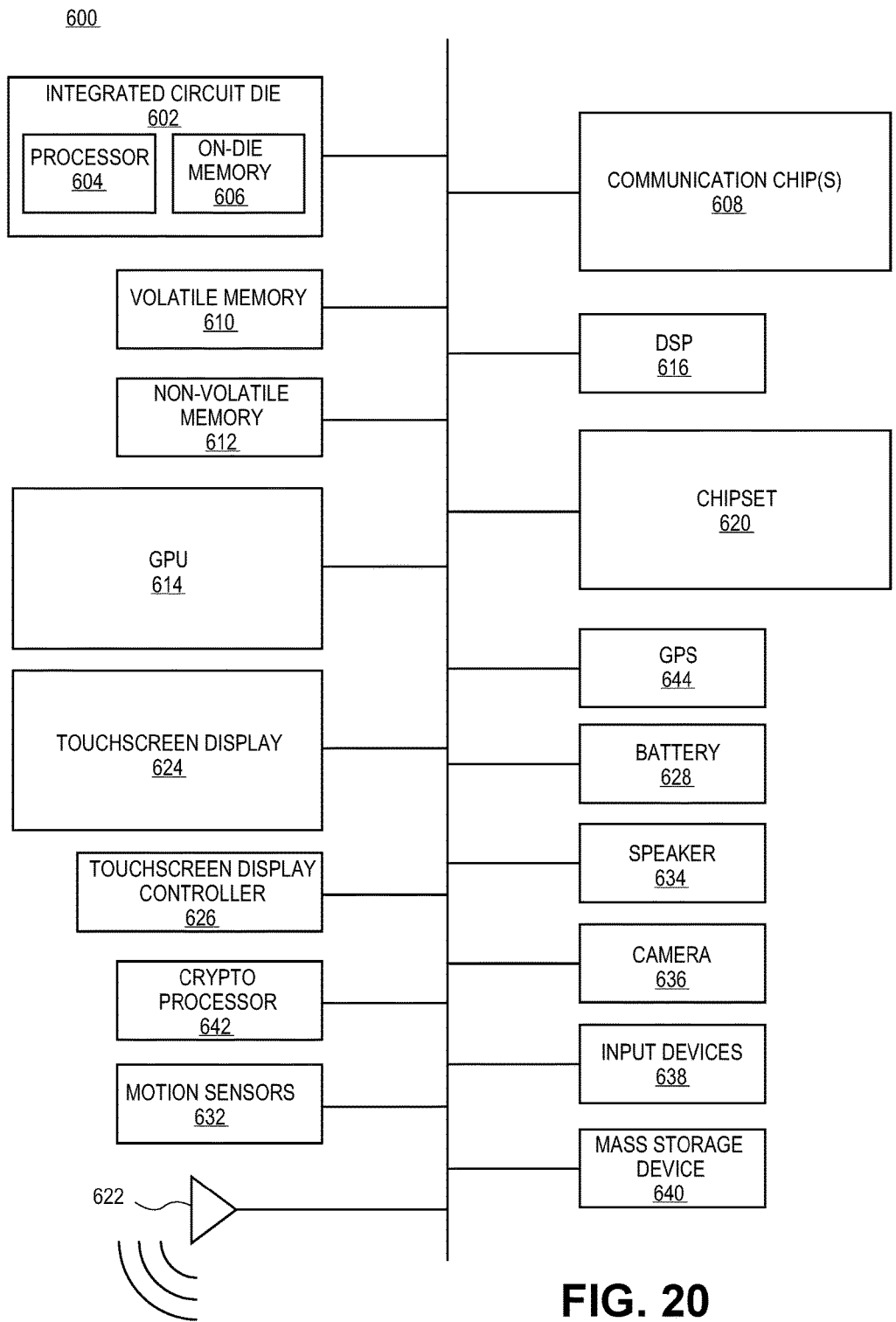
FIG. 20 illustrates an embodiment of a computing device.

FIG. 20 illustrates a computing device 600 in accordance with one embodiment. The computing device 600 may include a number of components. In one embodiment, these components are attached to one or more motherboards. In an alternate embodiment, these components are fabricated onto a single system-on-a-chip (SoC) die rather than a motherboard. The components in the computing device 600 include, but are not limited to, an integrated circuit die 602 and at least one communication chip 608. In some implementations the communication chip 608 is fabricated as part of the integrated circuit die 602. The integrated circuit die 602 may include a CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (a specialized processor that executes cryptographic algorithms within hardware), a chipset 620, an antenna 622, a display or a touchscreen display 624, a touchscreen controller 626, a battery 628 or other power source, a power amplifier (not shown), a global positioning system (GPS) device 644, a compass 630, a motion coprocessor or sensors 632 (that may include an accelerometer, a gyroscope, and a compass), a speaker 634, a camera 636, user input devices 638 (such as a keyboard, mouse, stylus, and touchpad), and a mass storage device 640 (such as hard disk drive, compact disk (CD), digital versatile disk (DVD), and so forth).

The communications chip 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 608. For instance, a first communication chip 608 may be dedicated to shorter range wireless communications such as Wi-Fi and Bluetooth and a second communication chip 608 may be dedicated to longer range wireless communications such as GPS, EDGE, GPRS, CDMA, WiMAX, LTE, Ev-DO, and others.

The processor 604 of the computing device 600 includes one or more devices, such as transistors or metal interconnects. The term "processor" may refer to any device or portion of a device that processes electronic data from registers and/or memory to transform that electronic data into other electronic data that may be stored in registers and/or memory.

The communication chip 608 may also include one or more devices, such as transistors or metal interconnects.

In further embodiments, another component housed within the computing device 600 may contain one or more devices, such as transistors or metal interconnects.

In various embodiments, the computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

Example 1 is a method including forming a device stack including a dielectric layer between a fixed magnetic layer and a free magnetic layer on a fully-crystalline sacrificial film or substrate including a crystal lattice similar to the crystal lattice of the dielectric material; and transferring the device stack from the sacrificial film to a device substrate.

In Example 2, forming the device stack of the method of Example 1 includes a forming an electrode layer of an electrically conductive material on the fully-crystalline sacrificial film or substrate and forming one of the fixed magnetic layer and the free magnetic layer on the electrode layer.

In Example 3, forming the device stack of the method of Example 2 includes forming a synthetic antiferromagnet between the electrode and the one of the fixed magnetic layer and the free magnetic layer.

In Example 4, the electrically conductive material of the electrode layer of the method of Example 2 has a crystal lattice similar to the crystal lattice of the sacrificial film or substrate.

In Example 5, the device stack of the method of Example 1 includes a spin transfer torque memory stack.

In Example 6, the dielectric layer and the fully crystalline sacrificial film or substrate each of the method of Example 5 includes magnesium oxide.

In Example 7, the device stack of the method of any of Examples 5 or 6 is formed on a fully-crystalline sacrificial film on a substrate of a material different than a material of the film.

In Example 8, the device stack of the method of any of Examples 5 or 6 is formed on a fully-crystalline sacrificial substrate.

In Example 9, the device stack of the method of any of Examples 5 or 6 includes a multi-ferroic device stack.

In Example 10, a device stack formed by any of the methods of Examples 1-9.

Example 11 is a method comprising forming a spin transfer torque memory stack on a fully-crystalline sacrificial film or substrate, the spin transfer torque memory stack comprising a dielectric layer between a fixed magnetic layer and a free magnetic layer wherein the fixed magnetic layer and the free magnetic layer each have a crystalline lattice conforming to the crystalline lattice of the sacrificial film or substrate; and transferring the memory stack from the sacrificial film to a device substrate.

In Example 12, forming the device stack of the method of Example 11 includes a forming an electrode layer of an electrically conductive material on the fully-crystalline sacrificial film or substrate and forming one of the fixed magnetic layer and the free magnetic layer on the electrode layer.

In Example 13, forming the device stack of the method of Example 12 includes forming a synthetic antiferromagnet between the electrode and the one of the fixed magnetic layer and the free magnetic layer.

In Example 14, the electrically conductive material of the electrode layer of the method of Example 12 has a crystal lattice similar to the crystal lattice of the sacrificial film or substrate.

In Example 15, the dielectric layer and the fully crystalline sacrificial film or substrate each of the method of Example 11 includes magnesium oxide.

In Example 16, the device stack of the method of Example 15 is formed on a fully-crystalline sacrificial film on a substrate of a material different than a material of the film.

In Example 17 the device stack of the method of Example 15 is formed on a fully-crystalline sacrificial substrate.

In Example 18, a device stack formed by any of the methods of Examples 11-17.

Example 19 is an apparatus including a device stack including a dielectric layer between a fixed magnetic layer and a free magnetic layer on a device substrate wherein the fixed magnetic layer and the free magnetic layer each have a crystalline lattice conforming to a crystalline lattice of the sacrificial film or substrate on which they were formed prior to transfer to the device substrate.

In Example 20, the device stack of the apparatus of Example 19 includes a spin transfer torque memory stack.

In Example 21, the dielectric layer of the apparatus of Example 20 includes magnesium oxide.

In Example 22, the fixed magnetic layer and the free magnetic layer each of the apparatus of Example 21 include CoFeB.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   forming a device stack including a dielectric layer between a fixed magnetic layer and a free magnetic layer on a fully-crystalline sacrificial film or substrate comprising a crystal lattice conforming to the crystal lattice of the dielectric layer, wherein forming the device stack comprises forming an electrode of an electrically conductive material on the fully-crystalline sacrificial film or substrate, and forming one of the fixed magnetic layer and the free magnetic layer on the electrode; and
   transferring the device stack from the sacrificial film to a device substrate.

2. The method of claim 1, wherein forming the device stack comprises forming a synthetic antiferromagnet between the electrode and the one of the fixed magnetic layer and the free magnetic layer.

3. The method of claim 1, wherein the electrically conductive material of the electrode has a crystal lattice conforming to the crystal lattice of the sacrificial film or substrate.

4. The method of claim 1, wherein the device stack comprises a spin transfer torque memory stack.

5. The method of claim 4, wherein the dielectric layer and the fully crystalline sacrificial film or substrate each comprises magnesium oxide (MgO).

6. The method of claim 4, wherein the device stack is formed on a fully-crystalline sacrificial film on a substrate of a material different than a material of the film.

7. The method of claim 4, wherein the device stack is formed on a fully-crystalline sacrificial substrate.

8. The method of claim 4, wherein the device stack comprises a multi-ferroic device stack.

9. A method comprising:
   forming a spin transfer torque memory stack on a fully-crystalline sacrificial film or substrate, the spin transfer torque memory stack comprising a dielectric layer between a fixed magnetic layer and a free magnetic layer wherein the fixed magnetic layer and the free magnetic layer each have a crystalline lattice conforming to the crystalline lattice of the fully-crystalline sacrificial film or substrate, wherein forming the spin transfer torque memory stack comprises forming an electrode of an electrically conductive material on the fully-crystalline sacrificial film or substrate, and forming one of the fixed magnetic layer and the free magnetic layer on the electrode; and
   transferring the memory stack from the sacrificial film to a device substrate.

10. The method of claim 9, wherein forming the device stack comprises forming a synthetic antiferromagnet between the electrode and the one of the fixed magnetic layer and the free magnetic layer.

11. The method of claim 9, wherein the electrically conductive material of the electrode has a crystal lattice similar to the crystal lattice of the sacrificial film or substrate.

12. The method of claim 9, wherein the dielectric layer and the fully crystalline sacrificial film or substrate each comprises magnesium oxide (MgO).

13. The method of claim 12, wherein the device stack is formed on a fully-crystalline sacrificial film on a substrate of a material different than a material of the film.

14. The method of claim 12, wherein the device stack is formed on a fully-crystalline sacrificial substrate.

15. An apparatus comprising:
   a device stack including a dielectric layer between a fixed magnetic layer and a free magnetic layer on a device substrate, wherein the device stack further comprises an electrode of an electrically conductive material connected to the device substrate through a glue layer, wherein one of the fixed magnetic layer and the free magnetic layer is formed on the electrode, and wherein the fixed magnetic layer, the free magnetic layer, and the electrically conductive material each have a same crystalline lattice.

16. The apparatus of claim 15, wherein the device stack comprises a spin transfer torque memory stack.

17. The apparatus of claim 16, wherein the dielectric layer comprises magnesium oxide (MgO).

18. The apparatus of claim 17, wherein the fixed magnetic layer and the free magnetic layer each comprise CoFeB.

* * * * *